US010900834B2

(12) United States Patent
Kasahara et al.

(10) Patent No.: US 10,900,834 B2
(45) Date of Patent: Jan. 26, 2021

(54) FABRY-PEROT INTERFERENCE FILTER HAVING LAYER WITH THINNED EDGE PORTION AND PRODUCTION METHOD FOR FABRY-PEROT INTERFERENCE FILTER

(71) Applicant: HAMAMATSU PHOTONICS K.K., Hamamatsu (JP)

(72) Inventors: Takashi Kasahara, Hamamatsu (JP); Katsumi Shibayama, Hamamatsu (JP); Masaki Hirose, Hamamatsu (JP); Toshimitsu Kawai, Hamamatsu (JP); Hiroki Oyama, Hamamatsu (JP); Yumi Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/303,209

(22) PCT Filed: May 1, 2017

(86) PCT No.: PCT/JP2017/017172
§ 371 (c)(1),
(2) Date: Nov. 20, 2018

(87) PCT Pub. No.: WO2017/203949
PCT Pub. Date: Nov. 30, 2017

(65) Prior Publication Data
US 2019/0204150 A1    Jul. 4, 2019

(30) Foreign Application Priority Data
May 27, 2016 (JP) ................................ 2016-106269

(51) Int. Cl.
*G01J 3/26* (2006.01)
*B23K 26/53* (2014.01)
(Continued)

(52) U.S. Cl.
CPC ............ *G01J 3/26* (2013.01); *B23K 26/0006* (2013.01); *B23K 26/064* (2015.10);
(Continued)

(58) Field of Classification Search
CPC ...... G01J 3/26; G01J 3/0243; B23K 26/0006; B23K 26/0643; B23K 26/53;
(Continued)

(56) References Cited

U.S. PATENT DOCUMENTS 6,436,794 B1   8/2002  Lee et al.
7,063,466 B2   6/2006  Ferguson
(Continued)

FOREIGN PATENT DOCUMENTS

CN    1059968 A    4/1992
CN    1085343 C    5/2002
(Continued)

OTHER PUBLICATIONS

International Preliminary Report on Patentability (IPRP) dated Mar. 7, 2019 that issued in WO Patent Application No. PCT/JP2017/024645.

(Continued)

*Primary Examiner* — Hwa Andrew Lee
(74) *Attorney, Agent, or Firm* — Faegre Drinker Biddle & Reath LLP

(57) ABSTRACT

The Fabry-Perot interference filter includes: a substrate having a first surface, a first laminate having a first mirror portion disposed on the first surface, a second laminate having a second mirror portion facing the first mirror portion with an air gap interposed therebetween, and an intermediate layer defining the air gap between the first and second laminate. The substrate has an outer edge portion positioned outside an outer edge of the intermediate layer when viewed from a direction perpendicular to the first surface. The (Continued)

second laminate further includes a covering portion covering the intermediate layer and a peripheral edge portion positioned on the first surface in the outer edge portion. The second mirror portion, the covering portion, and the peripheral edge portion are integrally formed so as to be continuous with each other. The peripheral edge portion is thinned along an outer edge of the outer edge portion.

7 Claims, 10 Drawing Sheets

(51) Int. Cl.
| | |
|---|---|
| *B23K 26/00* | (2014.01) |
| *B23K 26/064* | (2014.01) |
| *B81B 3/00* | (2006.01) |
| *B81C 1/00* | (2006.01) |
| *G01J 3/02* | (2006.01) |
| *G02B 5/28* | (2006.01) |
| *G02B 26/00* | (2006.01) |
| *B23K 26/06* | (2014.01) |
| B23K 103/00 | (2006.01) |
| B23K 101/40 | (2006.01) |

(52) U.S. Cl.
CPC .......... *B23K 26/0643* (2013.01); *B23K 26/53* (2015.10); *B81B 3/0072* (2013.01); *B81C 1/00539* (2013.01); *B81C 1/00634* (2013.01); *G01J 3/0243* (2013.01); *G02B 5/284* (2013.01); *G02B 26/001* (2013.01); *B23K 2101/40* (2018.08); *B23K 2103/56* (2018.08)

(58) Field of Classification Search
CPC .............. B23K 26/064; B23K 2103/56; B23K 2101/40; B81B 3/0072; B81B 3/00; B81C 1/00539; B81C 1/00634; B81C 1/00; G02B 5/284; G02B 26/001; G02B 26/00
See application file for complete search history.

(56) References Cited

U.S. PATENT DOCUMENTS

| | | | |
|---|---|---|---|
| 7,420,728 B2 | 9/2008 | Tung et al. | |
| 7,830,586 B2 | 11/2010 | Miles | |
| 9,261,753 B2 | 2/2016 | Guo et al. | |
| 2003/0002809 A1 | 1/2003 | Jian | |
| 2003/0116711 A1 | 6/2003 | Hara et al. | |
| 2006/0110851 A1 | 5/2006 | Burrell et al. | |
| 2007/0041076 A1 | 2/2007 | Zhong et al. | |
| 2007/0057999 A1 | 3/2007 | Kuroda | |
| 2007/0202628 A1 | 8/2007 | Wuertz | |
| 2009/0109423 A1* | 4/2009 | Carr .................... | G01L 9/0079 356/73 |
| 2010/0015782 A1 | 1/2010 | Yu et al. | |
| 2011/0279824 A1 | 11/2011 | Blomberg et al. | |
| 2012/0287138 A1 | 11/2012 | Zhong et al. | |
| 2013/0059428 A1 | 3/2013 | Arai | |
| 2013/0329232 A1 | 12/2013 | Antila et al. | |
| 2014/0099777 A1 | 4/2014 | Mackh et al. | |
| 2014/0111811 A1* | 4/2014 | Tuohiniemi ......... | G02B 26/001 356/519 |
| 2015/0138642 A1 | 5/2015 | Banerjee et al. | |
| 2015/0311664 A1 | 10/2015 | Bulovic et al. | |
| 2016/0370573 A1 | 12/2016 | Shibayama et al. | |

FOREIGN PATENT DOCUMENTS

| | | |
|---|---|---|
| CN | 1758986 A | 4/2006 |
| CN | 1849699 A | 10/2006 |
| CN | 1983557 A | 6/2007 |
| CN | 102375229 A | 3/2012 |
| CN | 103026468 A | 4/2013 |
| CN | 102449447 B | 6/2014 |
| CN | 105339829 A | 2/2016 |
| EP | 3018521 A1 | 5/2016 |
| EP | 3467567 A1 | 4/2019 |
| EP | 3505987 A1 | 7/2019 |
| EP | 3505988 A1 | 7/2019 |
| JP | 2007-036233 A | 2/2007 |
| JP | 2007-077864 A | 3/2007 |
| JP | 2008-103776 A | 5/2008 |
| JP | 2009-505162 A | 2/2009 |
| JP | 2009-081428 A | 4/2009 |
| JP | 2009-147108 A | 7/2009 |
| JP | 2011-027923 A | 2/2011 |
| JP | 2011-087272 A | 4/2011 |
| JP | 2011-181909 A | 9/2011 |
| JP | 2012-528345 A | 11/2012 |
| JP | 2013-506154 A | 2/2013 |
| JP | 2013-257561 A | 12/2013 |
| JP | 2015-011311 A | 1/2015 |
| JP | 2015-011312 A | 1/2015 |
| JP | 2015-521401 A | 7/2015 |
| JP | 2015-152713 A | 8/2015 |
| JP | 2015-199071 A | 11/2015 |
| JP | 2016-099583 A | 5/2016 |
| WO | WO-2007/022476 A1 | 2/2007 |
| WO | WO 2007/107176 A1 | 9/2007 |
| WO | WO-2010/075012 A2 | 7/2010 |
| WO | WO 2010/086502 A1 | 8/2010 |
| WO | WO 2010/136654 A1 | 12/2010 |
| WO | WO-2011/036346 A1 | 3/2011 |
| WO | WO-2013/158995 A1 | 10/2013 |
| WO | WO 2015/002028 A1 | 1/2015 |
| WO | WO 2015/122316 A1 | 8/2015 |
| WO | WO 2015/195123 A1 | 12/2015 |

OTHER PUBLICATIONS

International Preliminary Report on Patentability dated Dec. 6, 2018 for PCT/JP2017/017172.
International Preliminary Report on Patentability dated Dec. 6, 2018 for PCT/JP2017/017167.
International Preliminary Report on Patentability dated Dec. 6, 2018 for PCT/JP2017/019680.
A. Rissanen et al., "Tunable MOEMS Fabry-Perot interferometer for miniaturized spectral sensing in near-infrared", Proceedings of SPIE/ IS & T, vol. 8977, Mar. 7, 2014, p. 89770X, XP060034717.
S. Sullivan et al., "Non-Traditional Dicing of MEMS Devices", NSTI—Nanotech 2008, Jan. 1, 2008, XP055144278.
A. Hooper et al., "Review of wafer dicing techniques for via-middle process 3DI/TSV ultrathin silicon device wafers", 2015 IEEE 65th Electronic Components and Technology Conference (ECTC), IEEE, May 26, 2015, p. 1436-p. 1446, XP033175240.

* cited by examiner

Fig.4
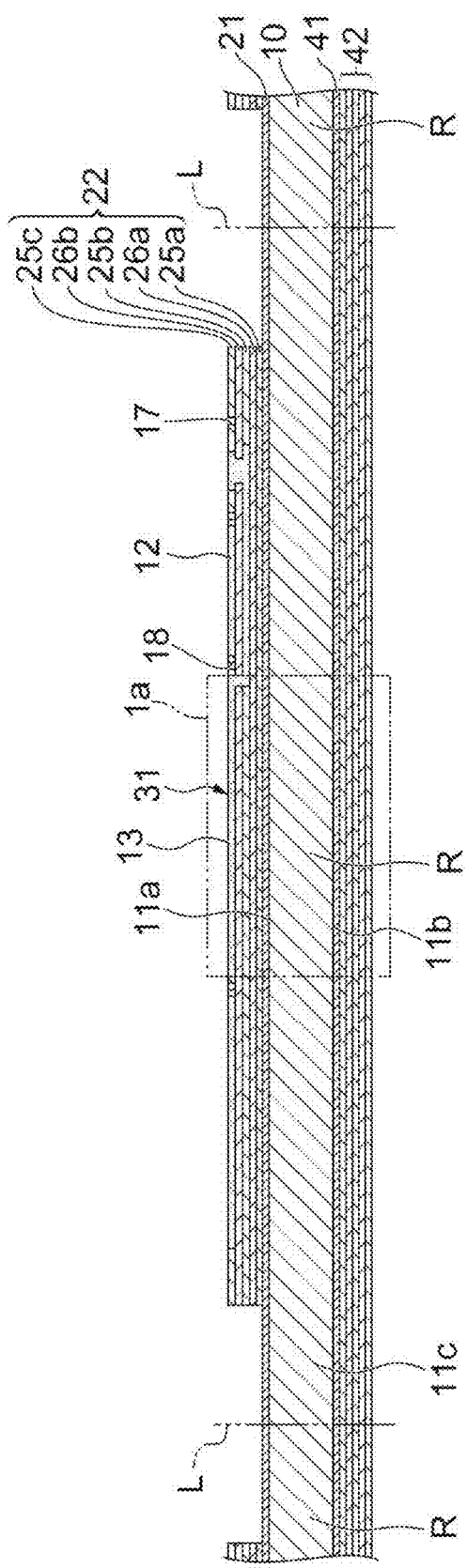
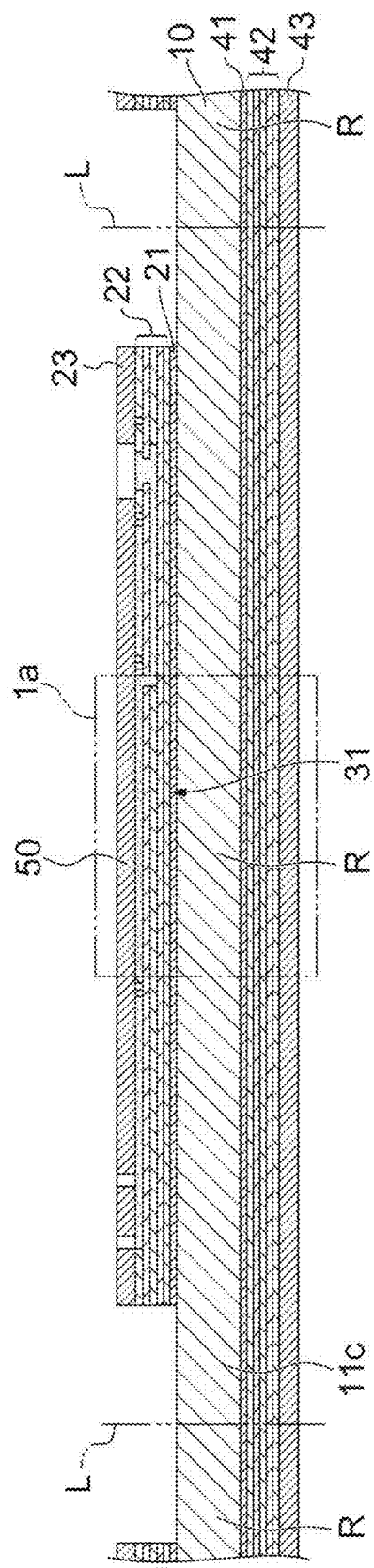

Fig.6
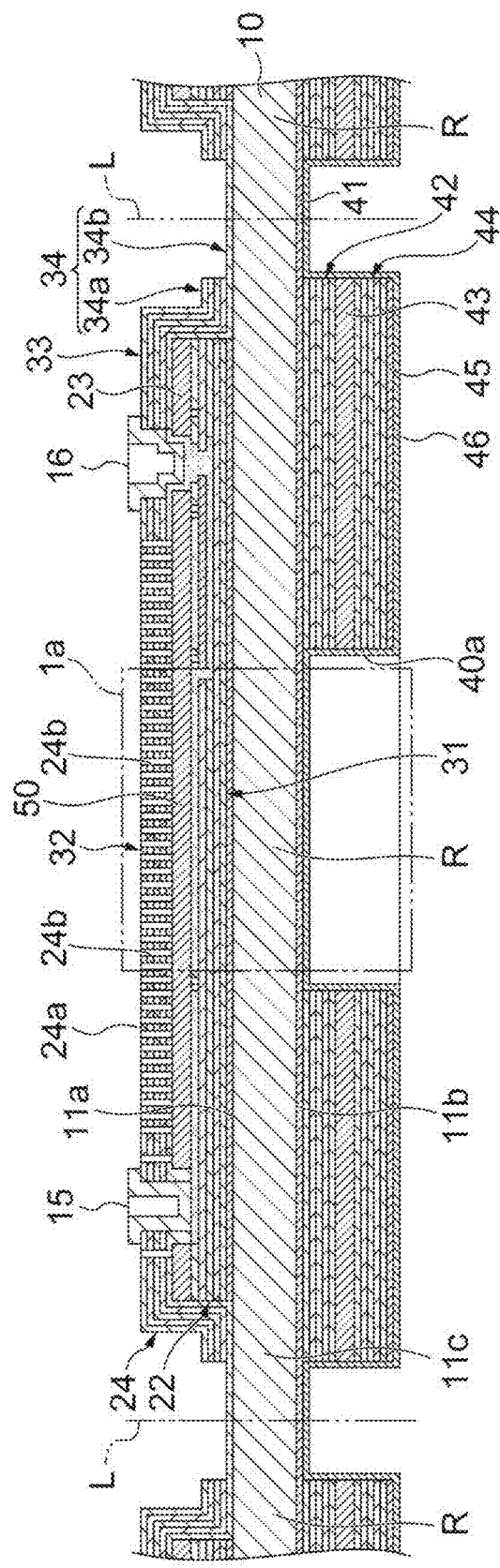
(a)
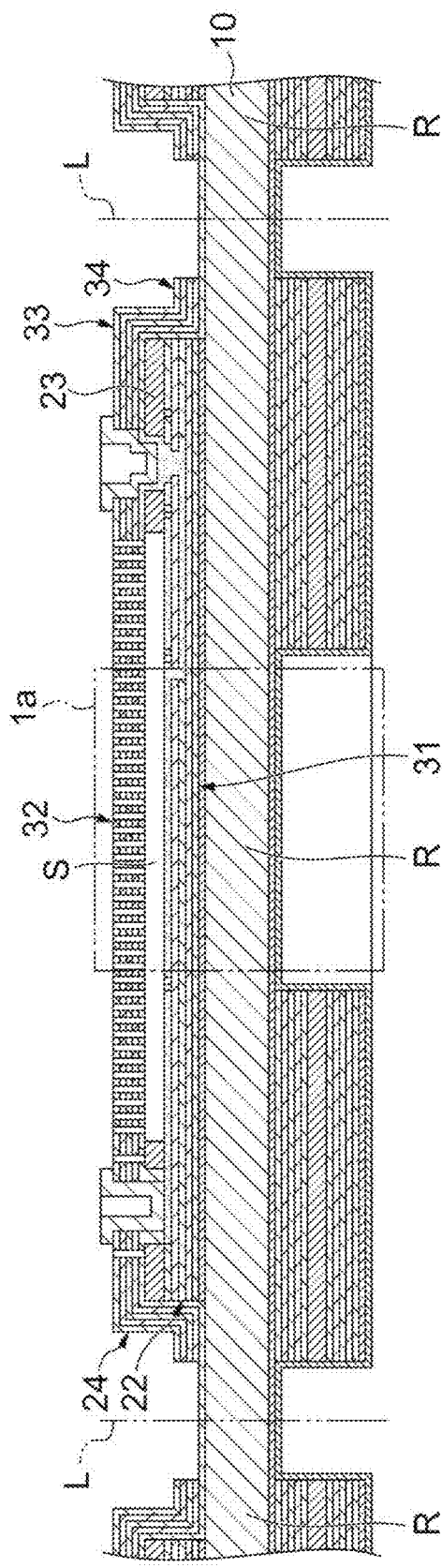
(b)

FABRY-PEROT INTERFERENCE FILTER HAVING LAYER WITH THINNED EDGE PORTION AND PRODUCTION METHOD FOR FABRY-PEROT INTERFERENCE FILTER

TECHNICAL FIELD

The present disclosure relates to a Fabry-Perot interference filter and a method for producing a Fabry-Perot interference filter.

BACKGROUND ART

A Fabry-Perot interference filter in the related art includes a substrate, a first layer having a first mirror portion disposed on the substrate, a second layer having a second mirror portion facing the first mirror portion with an air gap interposed therebetween, and an intermediate layer defining the air gap between the first layer and the second layer (refer to, for example, Patent Literature 1).

CITATION LIST

Patent Literature

Patent Literature 1: Japanese Unexamined Patent Publication No. 2013-257561

SUMMARY OF INVENTION

Technical Problem

In the Fabry-Perot interference filter as described above, because the respective thicknesses of the first layer, the intermediate layer and the second layer are extremely thin such as, for example, about several tens of nm to several tens of μm, there is a concern that peeling of each layer may occur in use or the like.

An object of one aspect of the present disclosure is to provide a Fabry-Perot interference filter and a method for producing a Fabry-Perot interference filter, which can suppress the occurrence of peeling in each layer on a substrate.

Solution to Problem

A Fabry-Perot interference filter according to one aspect of the present disclosure includes a substrate having a first surface, a first layer having a first mirror portion disposed on a first surface, a second layer having a second mirror portion facing the first mirror portion with an air gap interposed therebetween on a side opposite to the substrate with respect to the first mirror portion, and an intermediate layer defining the air gap between the first layer and the second layer, in which the substrate has an outer edge portion positioned outside an outer edge of the intermediate layer when viewed from a direction perpendicular to the first surface, in which the second layer further includes a covering portion covering the intermediate layer and a peripheral edge portion positioned on the first surface in the outer edge portion, in which the second mirror portion, the covering portion and the peripheral edge portion are integrally formed so as to be continuous with each other, and in which the peripheral edge portion is thinned along the outer edge of the outer edge portion.

In this Fabry-Perot interference filter, the second layer further includes, in addition to the first mirror portion, a covering portion covering the intermediate layer and a peripheral edge portion positioned on the first surface in the outer edge portion, and the first mirror portion, the covering portion and the peripheral edge portion are integrally formed so as to be continuous with each other. As a result, because the intermediate layer is covered with the second layer, peeling of the intermediate layer is suppressed. In addition, because the intermediate layer is covered with the second layer, deterioration of the intermediate layer is suppressed even in a case where the air gap is formed in the intermediate layer, for example, by etching, so that the stability of the intermediate layer is improved. Furthermore, in this Fabry-Perot interference filter, the peripheral edge portion is thinned along the outer edge of the outer edge portion. Thus, for example, even in a case where the Fabry-Perot interference filter is obtained by cutting the wafer including the portion corresponding to the substrate along the outer edge of the outer edge portion, degradation of each layer on the substrate is suppressed, and as a result, the stability of each layer is improved. As described above, according to the Fabry-Perot interference filter, it is possible to suppress the occurrence of peeling in each layer on the substrate. The phrase "the peripheral edge portion is thinned along the outer edge of the outer edge portion" denotes that "the thickness of the portion of the peripheral edge portion along the outer edge of the outer edge portion is smaller (including zero) than the thickness of the other portions excluding the portion of the peripheral edge portion along the outer edge of the outer edge portion".

In the Fabry-Perot interference filter according to one aspect of the present disclosure, the covering portion may cover the outer edge of the first layer. According to this, it is possible to more reliably suppress peeling of the first layer. In addition, for example, even in a case where the Fabry-Perot interference filter is obtained by cutting the wafer including the portion corresponding to the substrate along the outer edge of the outer edge portion, it is possible to more preferably suppress degradation of the first layer.

In the Fabry-Perot interference filter according to one aspect of the present disclosure, the first layer may be a laminate including a silicon nitride layer. According to this, because the silicon nitride layer of the first layer is not exposed to the outside, even in the case of forming an air gap in the intermediate layer by etching using, for example, a hydrofluoric acid gas, it is possible to suppress the generation of residues by reaction of the hydrofluoric acid gas and the silicon nitride layer.

In the Fabry-Perot interference filter according to one aspect of the present disclosure, the second layer is a laminate including a plurality of layers, and the peripheral edge portion may be thinned along the outer edge of the outer edge portion by removing a portion of the plurality of layers. According to this, it is possible to protect the first surface of the substrate by the remaining portions of the plurality of layers that are not removed.

The Fabry-Perot interference filter according to one aspect of the present disclosure may further include a third layer disposed on a second surface of the substrate opposing to the first surface. The third layer may be thinned along the outer edge of the outer edge portion. According to this, because the third layer is disposed on the second surface of the substrate, it is possible to suppress warping of the substrate caused by a mismatch in layer configuration between the first surface side and the second surface side of the substrate. In addition, for example, even in a case where the Fabry-Perot interference filter is obtained by cutting the wafer including the portion corresponding to the substrate along the outer edge of the outer edge portion, deterioration of the third layer is suppressed, and as a result, the stability of each layer of the third layer is improved. The phrase "the third layer is thinned along the outer edge of the outer edge portion" denotes that "the thickness of the portion of the third layer along the outer edge of the outer edge portion is smaller (including zero) than the thickness of the other portions excluding the portion of the third layer along the outer edge of the outer edge portion.

A method for producing a Fabry-Perot interference filter according to one aspect of the present disclosure is a method for producing the Fabry-Perot interference filter, including: a first step of preparing a wafer including a plurality of portions corresponding to the substrate and forming the first layer having the first mirror portion for each of the portions corresponding to the substrate; a second step of forming the intermediate layer having a removal scheduled portion corresponding to the air gap for each of the portions corresponding to the substrate after the first step; a third step of forming the second layer having the second mirror portion a plurality of through holes formed therein, the covering portion covering the intermediate layer, and the peripheral edge portion thinned along the outer edge of the outer edge portion for each of the portions corresponding to the substrate after the second step; a fourth step of forming the air gap positioned between the first mirror portion and the second mirror portion for each of the portions corresponding to the substrate by removing the removal scheduled portion by etching through the through hole after the third step; and a fifth step of obtaining the Fabry-Perot interference filter by cutting the wafer along the outer edge of the outer edge portion after the fourth step.

In the method for producing the Fabry-Perot interference filter, after forming the second layer having the covering portion covering the intermediate layer, the removal scheduled portion of the intermediate layer is removed by etching. Therefore, it is possible to suppress degradation of the intermediate layer at the time of removing the removal scheduled portion by etching. Furthermore, in the method for producing the Fabry-Perot interference filter, after forming the second layer having the peripheral edge portion thinned along the outer edge of the outer edge portion, the Fabry-Perot interference filter is obtained by cutting the wafer along the outer edge of the outer edge portion. Therefore, it is possible to suppress deterioration of each layer on the substrate at the time of cutting the wafer. In addition, in the Fabry-Perot interference filter produced by the method for producing the Fabry-Perot interference filter, because the intermediate layer is covered with the second layer, peeling of the intermediate layer is suppressed. As described above, according to the method for producing the Fabry-Perot interference filter, it is possible to suppress the occurrence of peeling in each layer on the substrate.

In the method for producing the Fabry-Perot interference filter according to one aspect of the present disclosure, in the fifth step, the wafer may be cut along the outer edge of the outer edge portion by forming a modified region in an inner portion of the wafer along the outer edge of the outer edge portion by irradiation with a laser beam and by extending a crack from the modified region in a thickness direction of the wafer. According to this, because the peripheral edge portion is thinned along the outer edge of the outer edge portion, it is possible to preferably focus the laser beam on the inner portion of the wafer, and thus, it is possible to cut the wafer with a high accuracy.

Advantageous Effects of Invention

According to one aspect of the present disclosure, it is possible to provide a Fabry-Perot interference filter and a method for producing a Fabry-Perot interference filter, which can suppress the occurrence of peeling in each layer on a substrate.

BRIEF DESCRIPTION OF DRAWINGS

FIGS. 4(a) and 4(b) are views for describing a method for producing the Fabry-Perot interference filter of FIG. 1.

FIGS. 6(a) and 6(b) are views for describing a method for producing the Fabry-Perot interference filter of FIG. 1.

DESCRIPTION OF EMBODIMENTS

Figure 1:
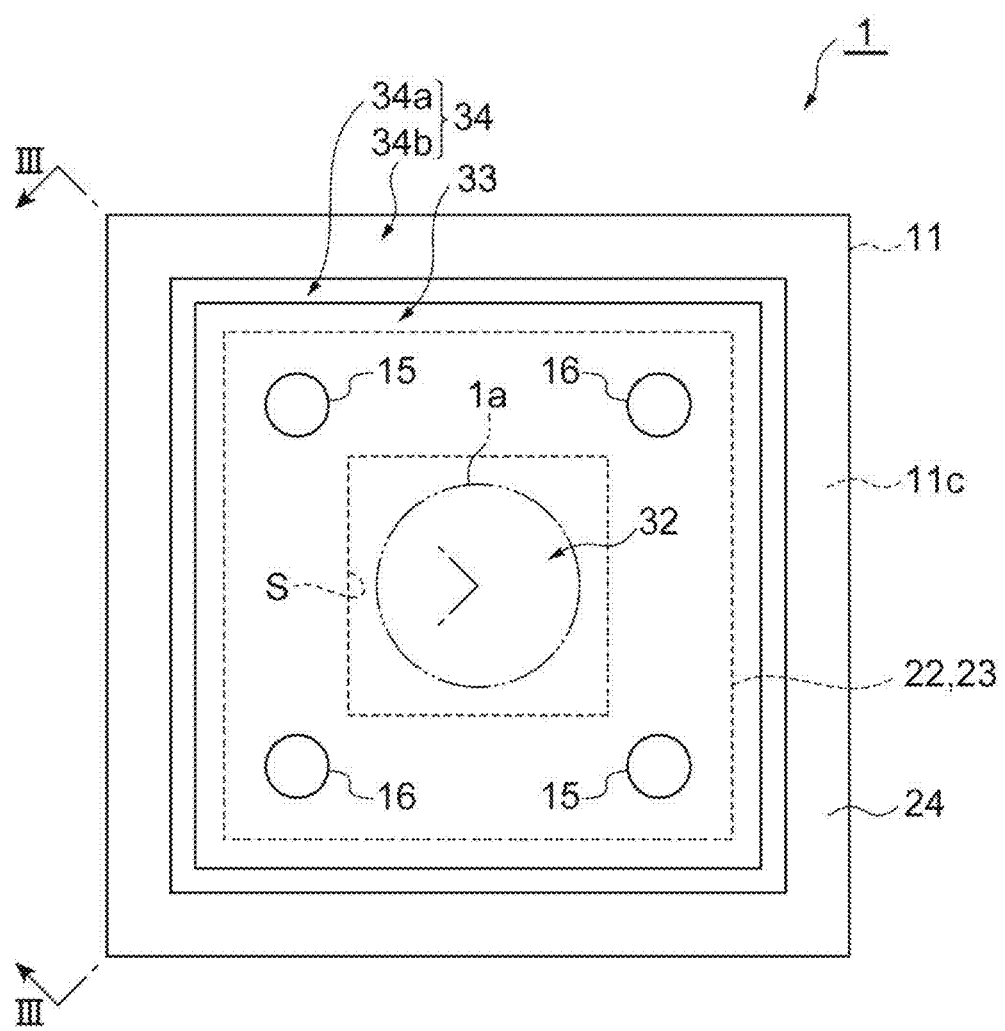
FIG. 1 is a plan view of a Fabry-Perot interference filter according to an embodiment of the present disclosure.

Hereinafter, an embodiment of the present disclosure will be described in detail with reference to the drawings. In addition, in the following description, the same reference numerals are used for the same or corresponding elements, and redundant description are omitted.

Figure 2:
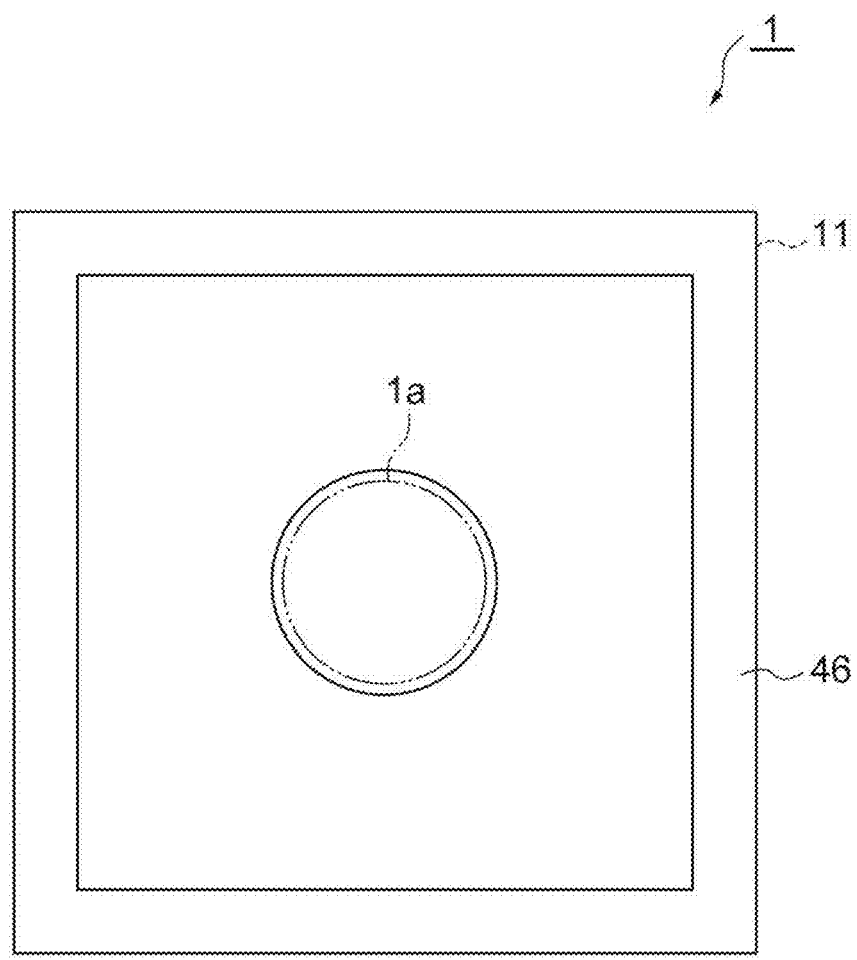
FIG. 2 is a bottom view of the Fabry-Perot interference filter of FIG. 1.
Figure 3:
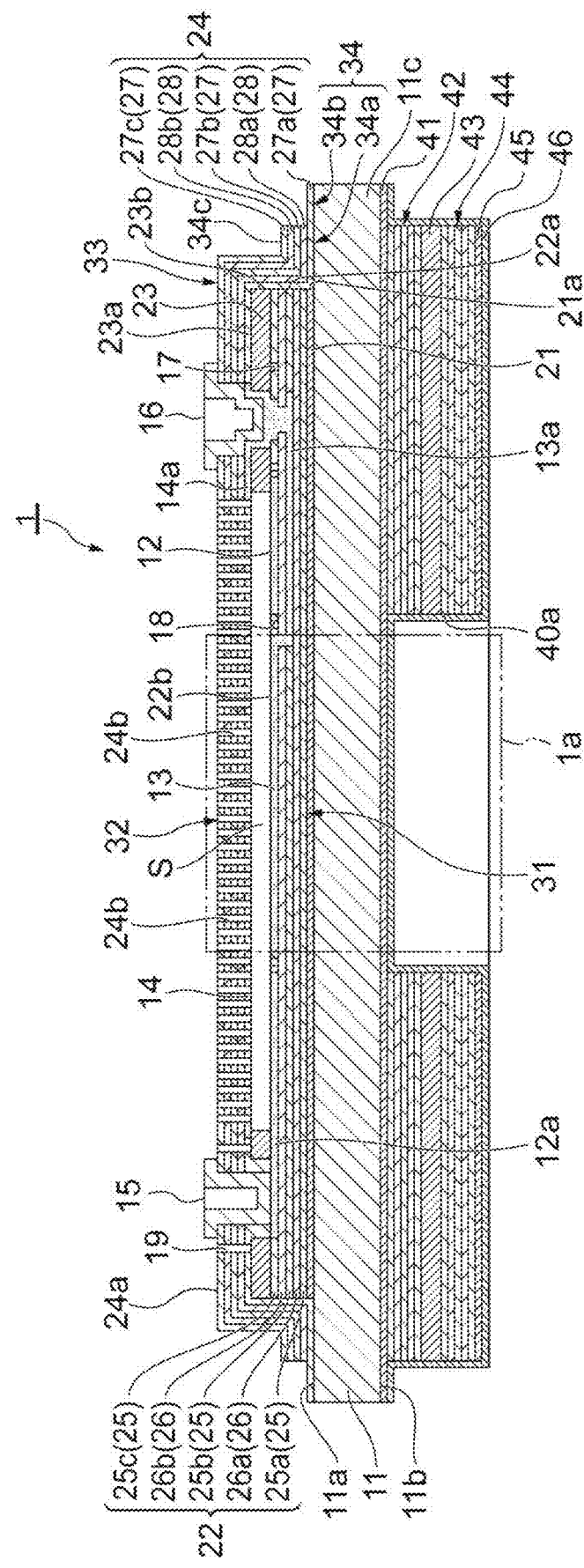
FIG. 3 is a cross-sectional view of the Fabry-Perot interference filter taken along line III-III of FIG. 1.
Figure 5:
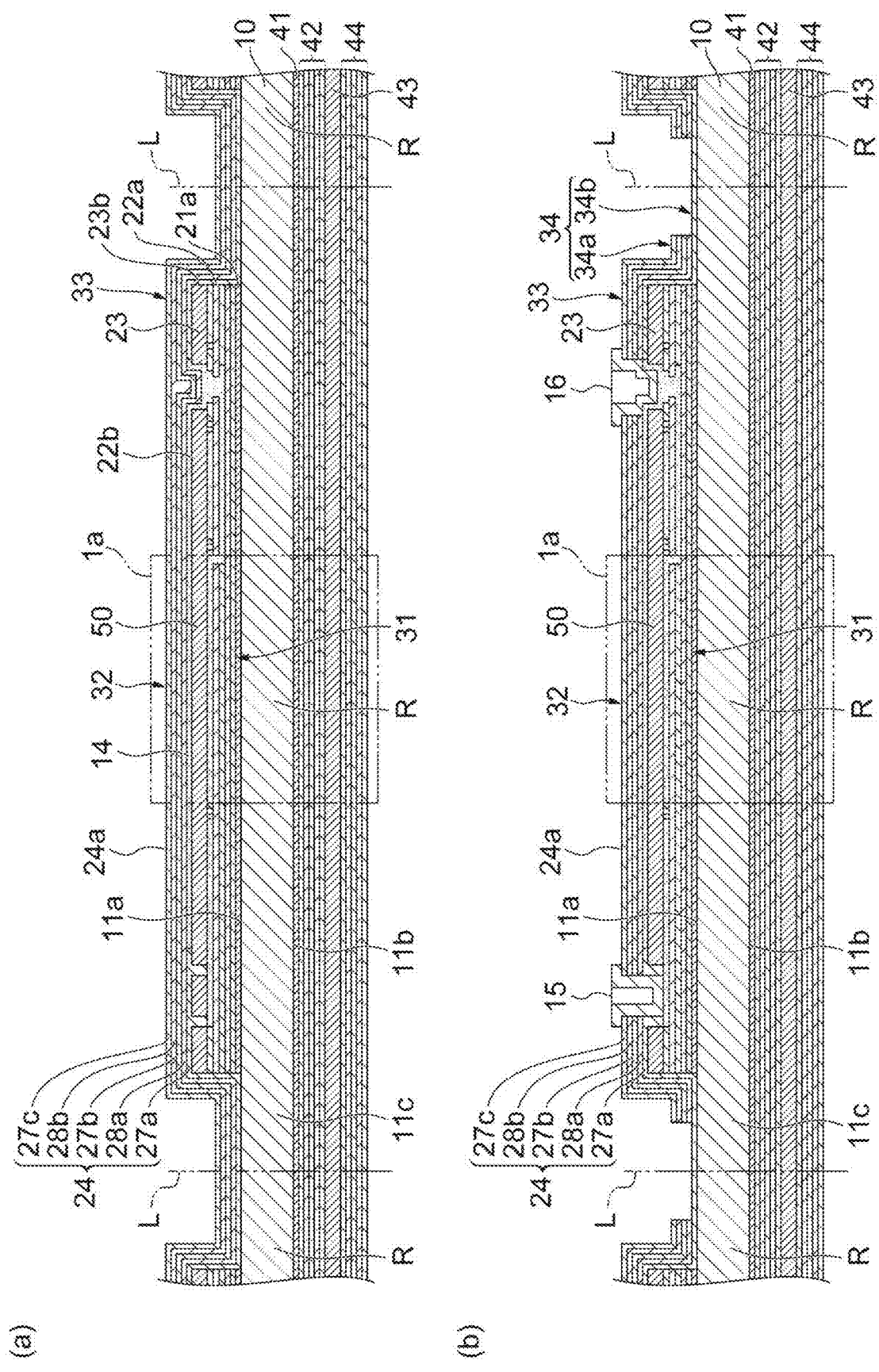
FIGS. 5(a) and 5(b) are views for describing a method for producing the Fabry-Perot interference filter of FIG. 1.
Figure 7:
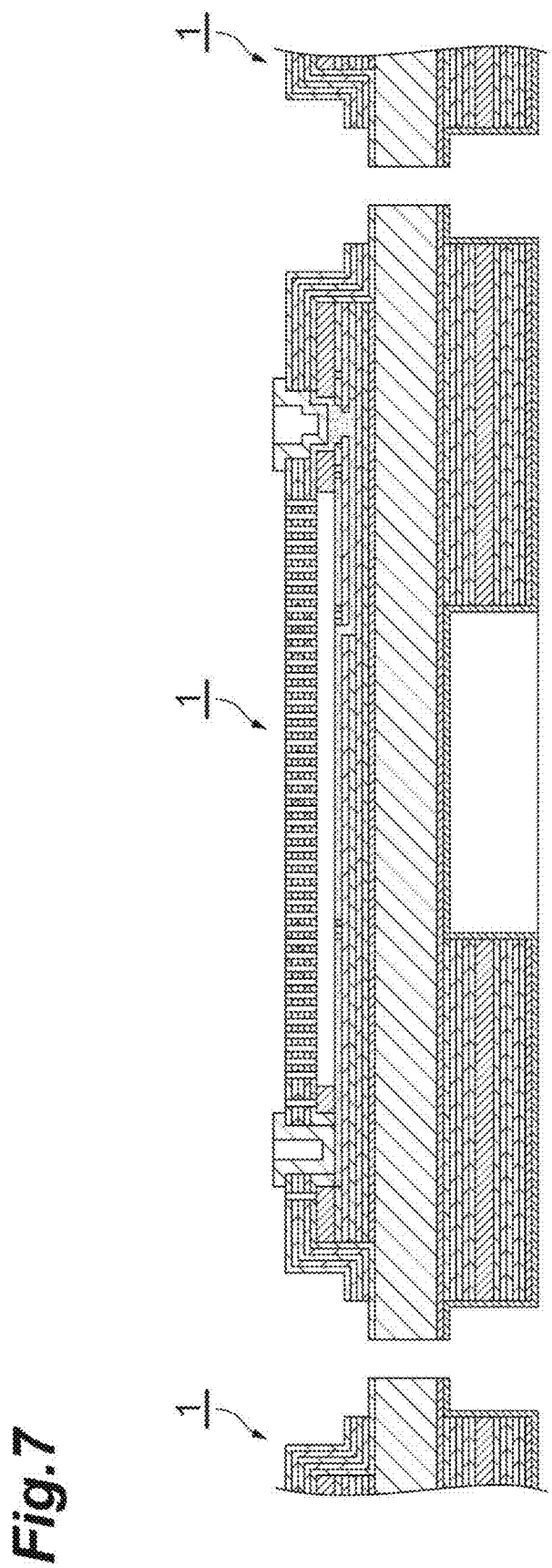
FIG. 7 is a view for describing a method for producing the Fabry-Perot interference filter of FIG. 1.

As illustrated in FIGS. 1, 2, and 3, the Fabry-Perot interference filter 1 includes a substrate 11. The substrate 11 has a first surface 11a and a second surface 11b opposing to the first surface 11a. An antireflection layer 21, a first laminate (first layer) 22, an intermediate layer 23, and a second laminate (second layer) 24 are laminated in this order on the first surface 11a. An air gap S is defined between the first laminate 22 and the second laminate 24 by a frame-shaped intermediate layer 23.

The shapes and positional relationships of portions when viewed from a direction perpendicular to the first surface 11a (in plan view) are as follows. The outer edge of the substrate 11 has, for example, a rectangular shape. The outer edge of the substrate 11 and the outer edge of the second laminate 24 coincide with each other. The outer edge of the antireflection layer 21, the outer edge of the first laminate 22, and the outer edge of the intermediate layer 23 coincide with each other. The substrate 11 has an outer edge portion 11 positioned outside the outer edge of the intermediate layer 23. The outer edge portion 11c is, for example, in a frame shape and surrounds the intermediate layer 23 when viewed from the direction perpendicular to the first surface 11a.

The Fabry-Perot interference filter 1 transmits light having a predetermined wavelength in the light transmission region 1a defined in the central portion thereof. The light transmission region 1a is, for example, a cylindrical region. The substrate 11 is made of, for example, silicon, quartz, glass, or the like. In a case where the substrate 11 is made of silicon, the antireflection layer 21 and the intermediate layer 23 are made of, for example, a silicon oxide. The thickness of the intermediate layer 23 is, for example, several tens of nm to several tens of μm.

A portion of the first laminate 22 corresponding to the light transmission region 1a functions as the first mirror portion 31. The first mirror portion 31 is disposed on the first surface 11a with the antireflection layer 21 interposed therebetween. The first laminate 22 is configured by alternately laminating a plurality of polysilicon layers 25 and a plurality of silicon nitride layers 26 layer by layer. In this embodiment, the polysilicon layer 25a, the silicon nitride layer 26a, the polysilicon layer 25b, the silicon nitride layer 26b, and the polysilicon layer 25c are laminated on the antireflection layer 21 in this order. It is preferable that the optical thickness of each of the polysilicon layer 25 and the silicon nitride layer 26 constituting the first mirror portion 31 is an integral multiple of ¼ of the center transmission wavelength. The first mirror portion 31 may be disposed directly on the first surface 11a without interposing the antireflection layer 21 therebetween.

A portion of the second laminate 24 corresponding to the light transmission region 1a functions as the second mirror portion 32. The second mirror portion 32 faces the first mirror portion 31 with the air gap S interposed therebetween on the side opposite to the substrate 11 with respect to the first mirror portion 31. The second mirror portion 32 is disposed on the first surface 11a with the antireflection layer 21, the first laminate 22, and the intermediate layer 23 interposed therebetween. The second laminate 24 is configured by alternately laminating a plurality of polysilicon layers 27 and a plurality of silicon nitride layers 28 layer by layer. In this embodiment, the polysilicon layer 27a, the silicon nitride layer 28a, the polysilicon layer 27b, the silicon nitride layer 28b, and the polysilicon layer 27c are laminated on the intermediate layer 23 in this order. It is preferable that the optical thickness of each of the polysilicon layer 27 and the silicon nitride layer 28 constituting the second mirror portion 32 is an integral multiple of ¼ of the center transmission wavelength.

In the first laminate 22 and the second laminate 24, a silicon oxide layer may be used instead of the silicon nitride layer. In addition, as a material of each layer constituting the first laminate 22 and the second laminate 24, there may be used a titanium oxide, a tantalum oxide, a zirconium oxide, a magnesium fluoride, an aluminum oxide, a calcium fluoride, silicon, germanium, a zinc sulfide, or the like.

In the second laminate 24, in a portion corresponding to the air gap S, a plurality of through holes 24b extending from the surface 24a of the second laminate 24 on the side opposite to the intermediate layer 23 to the air gap S are formed. The plurality of through holes 24b are formed to such an extent that the through holes do not substantially affect the function of the second mirror portion 32. The plurality of through holes 24b are used to form the air gap S by removing a portion of the intermediate layer 23 by etching.

In addition to the second mirror portion 32, the second laminate 24 further has a covering portion 33 and a peripheral edge portion 34. The second mirror portion 32, the covering portion 33, and the peripheral edge portion 34 have the same laminate structure and are integrally formed so as to be continuous with each other. The covering portion 33 surrounds the second mirror portion 32 when viewed from the direction perpendicular to the first surface 11a. The covering portion 33 covers the surface 23a of the intermediate layer 23 on the side opposite to the substrate 11, the side surface 23b of the intermediate layer 23, the side surface 22a of the first laminate 22, and the side surface 21a of the antireflection layer 21 and reaches the first surface 11a. That is, the covering portion 33 covers the outer edge of the intermediate layer 23, the outer edge of the first laminate 22, and the outer edge of the antireflection layer 21.

The peripheral edge portion 34 surrounds the covering portion 33 when viewed from the direction perpendicular to the first surface 11a. The peripheral edge portion 34 is positioned on the first surface 11a in the outer edge portion 11c. The outer edge of the peripheral edge portion 34 coincides with the outer edge of the substrate 11 when viewed from the direction perpendicular to the first surface 11a.

The peripheral edge portion 34 is thinned along the outer edge of the outer edge portion 11c. That is, the portion of the peripheral edge portion 34 along the outer edge of the outer edge portion 11c is thinner than the other portions excluding the portions of the peripheral edge portion 34 along the outer edge. In this embodiment, the peripheral edge portion 34 is thinned by removing a portion of the polysilicon layer 27 and the silicon nitride layer 28 constituting the second laminate 24. The peripheral edge portion 34 has a non-thinned portion 34a continuous with the covering portion 33 and a thinned portion 34b surrounding the non-thinned portion 34a. In the thinned portion 34b, the polysilicon layer 27 and the silicon nitride layer 28 other than the polysilicon layer 27a directly provided on the first surface 11a are removed.

The height of the surface 34c of the non-thinned portion 34a on the side opposite to the substrate 11 from the first surface 11a is lower than the height of the surface 23a of the intermediate layer 23 from the first surface 11a. The height of the surface 34c of the non-thinned portion 34a from the first surface 11a is, for example, 700 nm to 1400 nm. The height of the surface 23a of the intermediate layer 23 from the first surface 11a is, for example, 2000 nm to 4000 nm. The width of the thinned portion 34b (the distance between the outer edge of the non-thinned portion 34a and the outer edge of the outer edge portion 11c) is 0.01 times or more the thickness of the substrate 11. The width of the thinned portion 34b is, for example, 5 μm to 400 μm. The thickness of the substrate 11 is, for example, 500 μm to 800 μm.

A first electrode 12 is formed in the first mirror portion 31 so as to surround the light transmission region 1a. The first electrode 12 is formed by doping impurities into the polysilicon layer 25c to lower the resistance thereof. The second electrode 13 is formed in the first mirror portion 31 so as to include the light transmission region 1a. The second electrode 13 is formed by doping impurities into the polysilicon layer 25c to lower the resistance thereof. The size of the second electrode 13 is preferably the size including the entire light transmission region 1a, but may be substantially the same as that of the light transmission region 1a.

A third electrode 14 is formed in the second mirror portion 32. The third electrode 14 faces the first electrode 12 and the second electrode 13 with the air gap S interposed therebetween. The third electrode 14 is formed by doping impurities into the polysilicon layer 27a to lower the resistance thereof.

Terminals 15 are provided in a pair so as to face each other with the light transmission region 1a interposed therebetween. Each terminal 15 is disposed in a through hole extending from the surface 24a of the second laminate 24 to the first laminate 22. Each terminal 15 is electrically connected to the first electrode 12 via the wiring 12a.

Terminals 16 are provided in a pair so as to face each other with the light transmission region 1a interposed therebetween. Each terminal 16 is disposed in a through hole extending from the surface 24a of the second laminate 24 to an inner portion of the intermediate layer 23. Each terminal 16 is electrically connected to the second electrode 13 via the wiring 13a and is also electrically connected to the third electrode 14 via the wiring 14a. The direction in which the pair of terminals 15 face each other and the direction in which the pair of terminals 16 face each other are perpendicular to each other (refer to FIG. 1).

Trenches 17 and 18 are provided with the surface 22b of the first laminate 22. The trench 17 extends annularly so as to surround a portion of the wiring 13a connected to the terminal 16. The trench 17 electrically insulates the first electrode 12 from the wiring 13a. The trench 18 extends annularly along an inner edge of the first electrode 12. The trench 18 electrically insulates the first electrode 12 from the region inside the first electrode 12 (the second electrode 13). The region in each of the trench 17 and 18 may be an insulating material or an air gap.

A trench 19 is provided with the surface 24a of the second laminate 24. The trench 19 extends annularly so as to surround the terminal 15. The trench 19 electrically insulates the terminal 15 from the third electrode 14. The region in the trench 19 may be an insulating material or an air gap.

An antireflection layer 41, a third laminate (third layer) 42, an intermediate layer (third layer) 43, and a fourth laminate (third layer) 44 are laminated in this order on the second surface 11b of the substrate 11. The antireflection layer 41 and the intermediate layer 43 have structures similar to those of the antireflection layer 21 and the intermediate layer 23, respectively. The third laminate 42 and the fourth laminate 44 have laminate structures symmetrical to the first laminate 22 and the second laminate 24 with respect to the substrate 11, respectively. The antireflection layer 41, the third laminate 42, the intermediate layer 43, and the fourth laminate 44 have a function of suppressing warping of the substrate 11.

The third laminate 42, the intermediate layer 43 and the fourth laminate 44 are thinned along the outer edge of the outer edge portion 11c. That is, the portions of the third laminate 42, the intermediate layer 43, and the fourth laminate 44 along the outer edge of the outer edge portion 11c are thinner than other portions excluding the portions of the third laminate 42, the intermediate layer 43, and the fourth laminate 44 along the outer edge. In this embodiment, the third laminate 42, the intermediate layer 43, and the fourth laminate 44 are thinned by entirely removing the third laminate 42, the intermediate layer 43, and the fourth laminate 44 in the portions overlapping with the thinned portion 34b when viewed from the direction perpendicular to the first surface 11a.

An opening 40a is provided with the third laminate 42, the intermediate layer 43 and the fourth laminate 44 so as to include the light transmission region 1a. The opening 40a has substantially the same diameter as the size of the light transmission region 1a. The opening 40a is opened to the light emitting side, and the bottom surface of the opening 40a reaches the antireflection layer 41.

A light shielding layer 45 is formed on the light-emitting-side surface of the fourth laminate 44. The light shielding layer 45 is made of, for example, aluminum or the like. A protective layer 46 is formed on the surface of the light shielding layer 45 and the inner surface of the opening 40a. The protective layer 46 covers the outer edges of the third laminate 42, the intermediate layer 43, the fourth laminate 44, and the light shielding layer 45 and covers the antireflection layer 41 on the outer edge portion 11c. The protective layer 46 is made of, for example, an aluminum oxide.

It is possible to ignore the optical influence by the protective layer 46 by setting the thickness of the protective layer 46 to 1 to 100 nm (preferably about 30 nm).

In the Fabry-Perot interference filter 1 configured as described above, when a voltage is applied between the first electrode 12 and the third electrode 14 through the terminals 15 and 16, an electrostatic force corresponding to the voltage is generated between the first electrode 12 and the third electrode 14. Due to the electrostatic force, the second mirror portion 32 is attracted toward the first mirror portion 31 side fixed to the substrate 11, and thus, the distance between the first mirror portion 31 and the second mirror portion 32 is adjusted. As described above, in the Fabry-Perot interference filter 1, the distance between the first mirror portion 31 and the second mirror portion 32 is variable.

The wavelength of light passing through the Fabry-Perot interference filter 1 depends on the distance between the first mirror portion 31 and the second mirror portion 32 in the light transmission region 1a. Therefore, by adjusting the voltage applied between the first electrode 12 and the third electrode 14, it is possible to appropriately select the wavelength of the transmitting light. At this time, the second electrode 13 has the same potential as the third electrode 14. Therefore, the second electrode 13 functions as a compensation electrode for maintaining the first mirror portion 31 and the second mirror portion 32 flat in the light transmission region 1a.

In the Fabry-Perot interference filter 1, for example, while varying the voltage applied to the Fabry-Perot interference filter 1 (that is, changing the distance between the first mirror portion 31 and the second mirror portion 32 in the Fabry-Perot interference filter 1), by detecting the light transmitted through the light transmission region 1a of the Fabry-Perot interference filter 1 by a photodetector, it is possible to obtain an optical spectrum.

As described above, in the Fabry-Perot interference filter 1, the second laminate 24 further includes the covering portion 33 covering the intermediate layer 23 and the peripheral edge portion 34 positioned on the first surface 11a in the outer edge portion 11c in addition to the first mirror portion 31, and the first mirror portion 31, the covering portion 33, and the peripheral edge portion 34 are integrally formed so as to be continuous with each other. As a result, because the intermediate layer 23 is covered with the second laminate 24, it is possible to suppress peeling of the intermediate layer 23. In addition, because the intermediate layer 23 is covered with the second laminate 24, even in a case where the air gap S is formed in the intermediate layer 23, for example, by etching, deterioration of the intermediate layer 23 is suppressed, and as a result, the stability of the intermediate layer 23 is improved. Furthermore, in the Fabry-Perot interference filter 1, the peripheral edge portion 34 is thinned along the outer edge of the outer edge portion 11c. Therefore, for example, even in a case where the Fabry-Perot interference filter 1 is obtained by cutting the wafer including the portion corresponding to the substrate 11 along the outer edge of the outer edge portion 11c, deterioration of each layer on the substrate 11 is suppressed, and as a result, the stability of each layer on the substrate is improved. As described above, according to the Fabry-Perot interference filter 1, it is possible to suppress the occurrence of peeling in each layer on the substrate 11. Furthermore, in the Fabry-Perot interference filter 1, because the side surface 23b of the intermediate layer 23 is covered with the second laminate 24, it is possible to suppress the incidence of light from the side surface 23b of the intermediate layer 23, and it is possible to suppress the generation of stray light.

In addition, in the Fabry-Perot interference filter 1, the covering portion 33 covers the outer edge of the first laminate 22. Therefore, it is possible to more reliably suppress peeling of the first laminate 22. In addition, for example, even in a case where the Fabry-Perot interference filter 1 is obtained by cutting a wafer including a portion corresponding to the substrate 11 along the outer edge of the outer edge portion 11c, it is possible to more preferably suppress deterioration of the first laminate 22.

In addition, in the Fabry-Perot interference filter 1, the outer edge of the silicon nitride layer 26 included in the first laminate 22 is covered with the covering portion 33. Therefore, because the silicon nitride layer 26 of the first laminate 22 is not exposed to the outside, even in the case of forming the air gap S in the intermediate layer 23 by etching using, for example, a hydrofluoric acid gas, it is possible to suppress the generation of residues by reaction of the hydrofluoric acid gas and the silicon nitride layer 26.

In addition, the Fabry-Perot interference filter 1 is thinned along the outer edge of the outer edge portion 11c by removing a portion of the polysilicon layer 27 and the silicon nitride layer 28 constituting the second laminate 24. Therefore, it is possible to protect the first surface 11a of the substrate 11 by the remaining portions of the polysilicon layer 27 and the silicon nitride layer 28 constituting the second laminate 24 that are not removed. Furthermore, in the Fabry-Perot interference filter 1, only the polysilicon layer 27a remains in the thinned portion 34b. Therefore, because the surface of the thinned portion 34b becomes smooth, for example, in order to cut the wafer including the portion corresponding to the substrate 11 along the outer edge of the outer edge portion 11c, even in a case where the laser beam is focused on an inner portion of the wafer along the outer edge of the outer edge portion 11c, it is possible to accurately cut the wafer by preferably focusing the laser beam on the inner portion of the wafer, and it is possible to more preferably suppress deterioration of each layer on the substrate 11.

In addition, in the Fabry-Perot interference filter 1, the third laminate 42 and the fourth laminate 44 are disposed on the second surface 11b of the substrate 11, and the third laminate 42 and the fourth laminate 44 are thinned along the outer edge the outer edge portion 11c. Therefore, it is possible to suppress warping of the substrate 11 caused by a mismatch in layer configuration between the first surface 11a side and the second surface 11b side of the substrate 11. Furthermore, for example, even in a case where the Fabry-Perot interference filter 1 is obtained by cutting the wafer including the portion corresponding to the substrate 11 along the outer edge of the outer edge portion 11c, deterioration of the third laminate 42 and the fourth laminate 44 is suppressed, and as a result, the stability of each layer on the substrate 11 is improved.

Next, an example of a method for producing the Fabry-Perot interference filter 1 will be described with reference to FIGS. 4 to 7. First, as illustrated in FIG. 4(a), a wafer 10 including a plurality of portions R corresponding to the substrate 11 is prepared, and the first laminate 22 having the first mirror portion 31 is formed for each of the portions R corresponding to the substrates 11 of the wafer 10 (first step). The wafer 10 is, for example, a silicon wafer. In the wafer 10, the portions R are arranged, for example, in a lattice pattern so as to be adjacent to each other. Dicing lines L are set on the boundary between the portions R.

In the first step, first, the antireflection layer 21 is formed on the first surface 11a of the portion R, and at the same time, the antireflection layer 41 is formed on the second surface 11b of the portion R. Subsequently, the polysilicon layer 25a, the silicon nitride layer 26a, the polysilicon layer 25b, the silicon nitride layer 26b, and the polysilicon layer 25c constituting the first laminate 22 are laminated in this order on the antireflection layer 21. Simultaneously with the lamination of the first laminate 22, the polysilicon layer and the silicon nitride layer constituting the third laminate 42 are laminated on the antireflection layer 41. At the time of lamination of the first laminate 22, after the polysilicon layer 25 and the silicon nitride layer 26 are laminated over the first surface 11a, portions of the polysilicon layer 25 and the silicon nitride layer 26, which are positioned on the outer edge portion 11c, when viewed from the direction perpendicular to the first surface 11a are removed by etching. In addition, in parallel with the lamination of the first laminate 22, the first electrode 12 and the second electrode 13 are formed by doping impurities into the polysilicon layers 25b and 25c to partially lower the resistance thereof. Subsequently, trenches 17 and 18 are formed by etching.

Subsequently, as illustrated in FIG. 4(b), the intermediate layer 23 having the removal scheduled portion 50 corresponding to the air gap S is formed for each portion R (second step). In the second step, first, the intermediate layer 23 is formed over the first surface 11a of the portion R so that the first laminate 22 is covered with the intermediate layer 23. Simultaneously with the formation of the intermediate layer 23, the intermediate layer 43 is formed on the third laminate 42. Subsequently, the portion of the intermediate layer 23 positioned on the outer edge portion 11c when viewed from the direction perpendicular to the first surface 11a is removed by etching. During this etching, the portion of the antireflection layer 21 positioned on the outer edge portion 11c when viewed from the direction perpendicular to the first surface 11a is removed. In addition, during this etching, the air gap is formed in the portion corresponding to the wiring 13a and terminals 15 and 16 in FIG. 3.

Subsequently, as illustrated in FIGS. 5(a), 5(b), and 6(a), the second laminate 24 having the second mirror portion 32 in which the plurality of through holes 24b are formed, the covering portion 33 which covers the intermediate layer 23, and the peripheral edge portion 34 which is thinned along the outer edge of the outer edge portion 11c is formed for each portion R (third step).

In the third step, first, the polysilicon layer 27a, the silicon nitride layer 28a, the polysilicon layer 27b, the silicon nitride layer 28b, and the polysilicon layer 27c constituting the second laminate 24 are laminated in this order on the intermediate layer 23. More specifically, as illustrated in FIG. 5(a), the second laminate 24 is laminated over the first surface 11a of the portion R so that the surface 23a and the side surface 23b of the intermediate layer 23, the side surface 22a of the first laminate 22, and the side surface 21a of the antireflection layer 21 are covered with the second laminate 24. Simultaneously with the lamination of the second laminate 24, the polysilicon layer and the silicon nitride layer constituting the fourth laminate 44 are laminated on the intermediate layer 43. Subsequently, as illustrated in FIG. 5(b), by removing the portions of the polysilicon layer 27 other than the polysilicon layer 27a and the silicon nitride layer 28 corresponding to the thinned portion 34b by etching, the peripheral edge portion 34 thinned along the outer edge of the outer edge portion 11c is formed. In addition, in parallel with the lamination of the second laminate 24, the third electrode 14 is formed by doping impurities into the polysilicon layer 27a to partially lower the resistance thereof. Subsequently, terminals 15 and 16 are formed.

Subsequently, as illustrated in FIG. 6(a), by partially etching the second laminate 24, the through holes 24b extending from the surface 24a of the second mirror portion 32 to the removal scheduled portion 50 are formed. Subsequently, a light shielding layer 45 is formed on the fourth laminate 44. Subsequently, by removing the portions of the third laminate 42, the intermediate layer 43, the fourth laminate 44, and the light shielding layer 45 overlapping with the thinned portion 34b when viewed from the perpendicular direction by etching, the third laminate 42, the intermediate layer 43 and the fourth laminate 44 are thinned along the outer edge of the outer edge portion 11c. In addition, during this etching, opening 40a is formed in the third laminate 42, the intermediate layer 43, the fourth laminate 44, and the light shielding layer 45. Subsequently, the protective layer 46 is formed on the surface of the light shielding layer 45 and on the inner surface of the opening 40a.

Subsequently, as illustrated in FIG. 6(b), by removing the removal scheduled portion 50 by etching through the through holes 24b, the air gap positioned between the first mirror portion 31 and the second mirror portion 32 S is formed for each portion R (fourth step). In the fourth step, the removal scheduled portion 50 is removed by gas phase etching through the through holes 24b. For this gas phase etching, for example, a hydrofluoric acid gas is used.

Subsequently, as illustrated in FIG. 6(b), the Fabry-Perot interference filter 1 is obtained by cutting the wafer 10 along the outer edge of the outer edge portion 11c in the dicing lines L (fifth step). In the fifth step, for example, the wafer 10 is cut along the outer edge of the outer edge portion 11c by forming a modified region in an inner portion of the wafer 10 along the outer edge of the outer edge portion 11c by irradiation with a laser beam from the first surface 11a side and by extending a crack in the thickness direction of the wafer 10 from the modified region.

As described above, in the method for producing the Fabry-Perot interference filter 1, after forming the second laminate 24 having the covering portion 33 covering the intermediate layer 23, the removal scheduled portion 50 of the intermediate layer 23 is removed by etching. Therefore, it is possible to suppress deterioration of the intermediate layer 23 at the time of removing the removal scheduled portion 50 by etching. Furthermore, in the method for producing the Fabry-Perot interference filter 1, after forming the second laminate 24 having the peripheral edge portion 34 thinned along the outer edge of the outer edge portion 11c, the Fabry-Perot interference filter 1 is obtained by cutting the wafer 10 along the outer edge of the outer edge portion 11c. Therefore, it is possible to suppress deterioration of each layer on the substrate 11 at the time of cutting the wafer 10. In addition, in the Fabry-Perot interference filter 1 produced by the method for producing the Fabry-Perot interference filter 1, because the intermediate layer 23 is covered with the second laminate 24, peeling of the intermediate layer 23 is suppressed. As described above, according to the method for producing the Fabry-Perot interference filter 1, it is possible to suppress the occurrence of peeling in each layer on the substrate 11.

In addition, in the method for producing the Fabry-Perot interference filter 1, the wafer 10 is cut by forming a modified region in an inner portion of the wafer 10 by irradiation with a laser beam and by extending a crack from the modified region in the thickness direction of the wafer 10. By forming the thinned portion 34b, it is possible to preferably focus the laser beam on an inner portion of the wafer 10, and thus, it is possible to cut the wafer 10 with a high accuracy.

Although an embodiment of the present disclosure has been described above, an aspect of the present disclosure is not limited to the embodiment described above. For example, the materials and shapes of the respective components are not limited to the above-described materials and shapes, and various materials and shapes can be adopted.

The peripheral edge portion 34 may be thinned by entirely removing the polysilicon layer 27 and the silicon nitride layer 28 in the thinned portion 34b. In this case, when viewed from the direction perpendicular to the first surface 11a, the outer edge of the peripheral edge portion 34 is positioned inside the outer edge portion of the outer edge portion 11c. In the thinned portion 34b, the polysilicon layer 27 or the silicon nitride layer 28 may be further disposed on the polysilicon layer 27a. That is, the thickness of the portion of the peripheral edge portion 34 along the outer edge of the outer edge portion 11c may be smaller (including zero) than the thickness of the other portion excluding the portion of the peripheral edge portion 34 along the outer edge of the outer edge portion 11c. The third laminate 42, the intermediate layer 43, and the fourth laminate 44 may be thinned by removing a portion of each layer in a region overlapping with the thinned portion 34b when viewed from the direction perpendicular to the first surface 11a. In other words, the thickness of the portions of the third laminate 42, the intermediate layer 43, and the fourth laminate 44 along the outer edge of the outer edge portion 11c may be smaller (including zero) than the thickness of the other portions excluding the portions of the third laminate 42, the intermediate layer 43, and the fourth laminate 44 along the outer edge of the outer edge portion 11c.

The first laminate 22 may be interposed between the peripheral edge portion 34 and the first surface 11a of the outer edge portion 11c. In this case, when viewed from the direction perpendicular to the first surface 11a, the outer edge of the first laminate 22 may be positioned between the outer edge of the intermediate layer 23 and the outer edge of the outer edge portion 11c and may coincide with the outer edge of the outer edge portion 11c. In this case, the portion (peripheral edge portion) positioned on the first surface 11a of the outer edge portion 11c in the first laminate 22 may be thinned along the outer edge of the outer edge portion 11c. According to this configuration, even in a case where the Fabry-Perot interference filter 1 is obtained by cutting the wafer 10 including the portion R corresponding to the substrate 11 along the outer edge of the outer edge portion 11c, it is possible to more preferably suppress deterioration of each layer on the substrate 11. Furthermore, because the peripheral edge portion of the first laminate 22 is thinned along the outer edge of the outer edge portion 11c, in a case where the wafer 10 is cut by forming a modified region in an inner portion of the wafer 10 by irradiation with a laser beam and by extending a crack in the thickness direction of the wafer 10 from the modified region, it is possible to more preferably irradiate the inner portion of the wafer 10 with the laser beam. In a case where the outer edge of the first laminate 22 coincides with the outer edge of the outer edge portion 11c, the peripheral edge portion 34 does not cover the outer edge of the first laminate 22.

The Fabry-Perot interference filter 1 may not have a laminate structure (the antireflection layer 41, the third laminate 42, the intermediate layer 43, the fourth laminate 44, the light shielding layer 45, and the protective layer 46)

provided on the second surface 11b of the substrate 11. The third laminate 42, the intermediate layer 43 and the fourth laminate 44 may not be thinned along the outer edge of the outer edge portion 11c. In the fifth step, the wafer 10 may be cut by another dicing method such as blade dicing. In the above-described embodiment, the thinned portion 34b continuously surrounds the non-thinned portion 34a. However, the thinned portion 34b may intermittently surround the non-thinned portion 34a. That is, the peripheral edge portion 34 may be thinned along at least a portion of the outer edge of the outer edge portion 11c.

In the above-described embodiment, the peripheral edge portion 34 may not be thinned along the outer edge of the outer edge portion 11c. Even in this case, because the intermediate layer 23 is covered with the second laminate 24, peeling of the intermediate layer 23 is suppressed. In addition, because the covering portion 33 covers the outer edge of the first laminate 22 and the first laminate 22 is covered with the second laminate 24, peeling of the first laminate 22 is suppressed.

Figure 8:
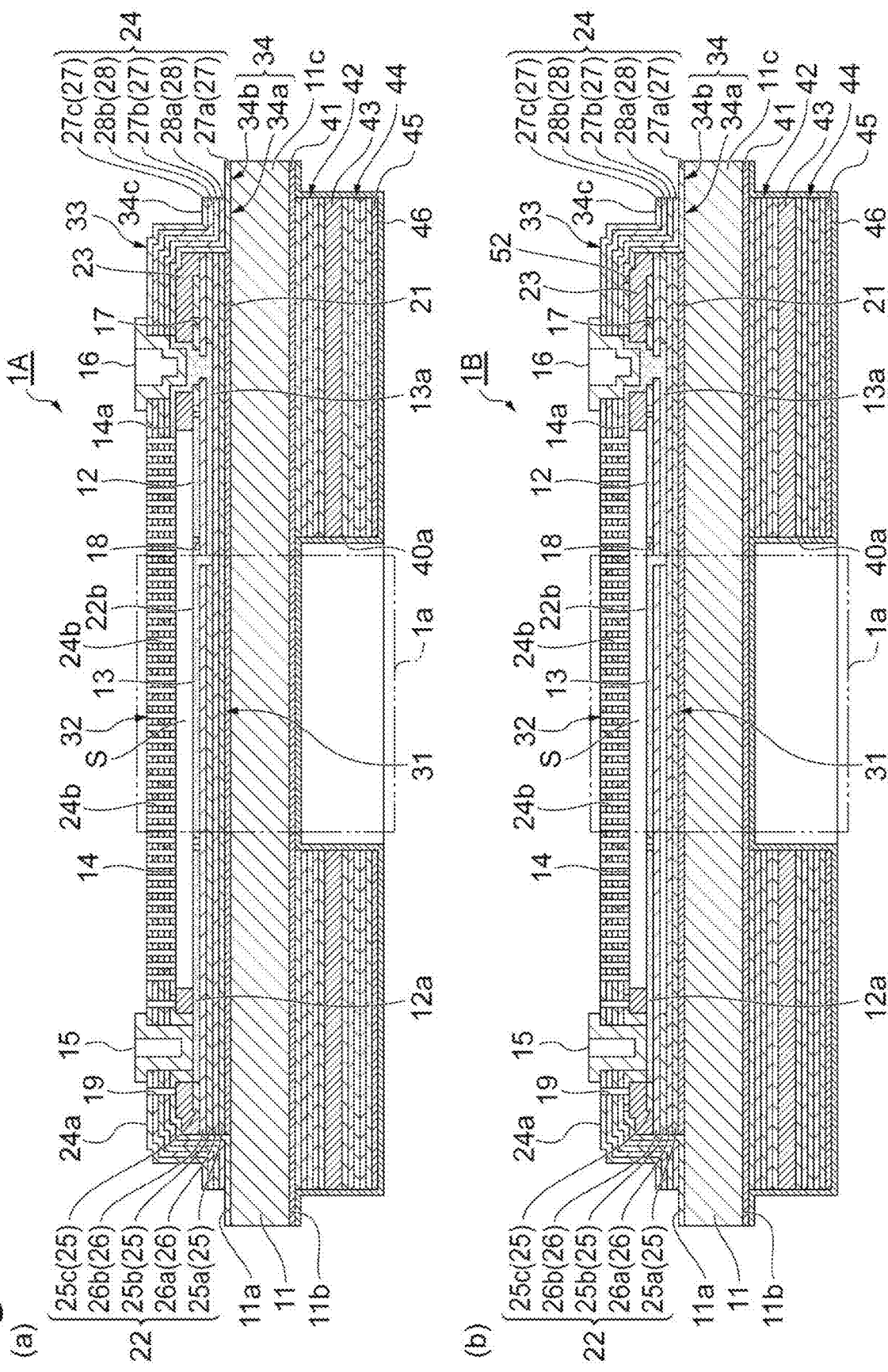
FIG. 8(a) is a cross-sectional view of a Fabry-Perot interference filter of Modified Example 1.
FIG. 8(b) is a cross-sectional view of a Fabry-Perot interference filter of Modified Example 2.

As in the Fabry-Perot interference filter 1A of Modified Example 1 illustrated in FIG. 8(a), in the Fabry-Perot interference filter 1 of the above-described embodiment, the outer edge of the polysilicon layer 25c may be positioned inside the outer edge of the first laminate 22 when viewed from the direction perpendicular to the first surface 11a, and the intermediate layer 23 may be interposed between the outer edge of the polysilicon layer 25c and the polysilicon layer 27a. According to Modified Example 1, similarly to the above-described embodiment, it is possible to suppress the occurrence of peeling in each layer on the substrate 11. Furthermore, in Modified Example 1, the electrical insulation between the polysilicon layer 25c in which the first electrode 12 is formed and the polysilicon layer 27a in which the third electrode 14 is formed can be enhanced. Therefore, it is possible to suppress the occurrence of leakage of current between the first electrode 12 and the third electrode 14 through the polysilicon layers 25c and 27a. As a result, it is possible to suppress an increase in the voltage applied between the first electrode 12 and the third electrode 14.

As in the Fabry-Perot interference filter 1B of Modified Example 2 illustrated in FIG. 8(b), in the Fabry-Perot interference filter 1A of Modified Example 1, a trench 52 extending annularly so as to surround the terminals 15 and 16 may be provided with the polysilicon layer 27a. According to Modified Example 2, similarly to the above-described embodiment, it is possible to suppress the occurrence of peeling in each layer on the substrate 11. Furthermore, in Modified Example 2, the electrical insulation between the polysilicon layer 25c in which the first electrode 12 is formed and the polysilicon layer 27a in which the third electrode 14 is formed can be further enhanced. Therefore, it is possible to further suppress the occurrence of leakage of current between the first electrode 12 and the third electrode 14 through the polysilicon layers 25c and 27a.

Figure 9:
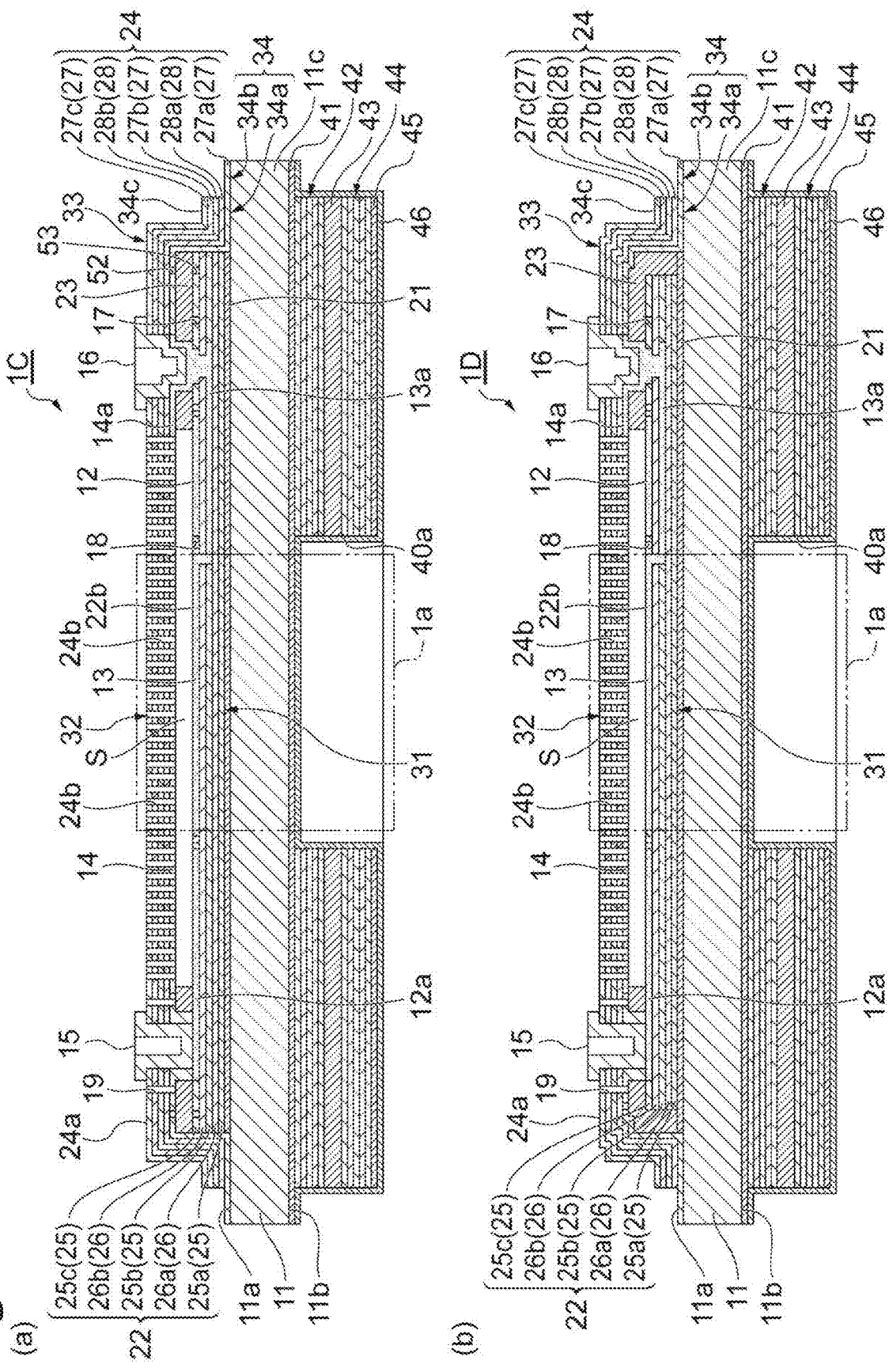
FIG. 9(a) is a cross-sectional view of a Fabry-Perot interference filter of Modified Example 3.
FIG. 9(b) is a cross-sectional view of a Fabry-Perot interference filter of Modified Example 4.

As in the Fabry-Perot interference filter 1C of Modified Example 3 illustrated in FIG. 9(a), in the Fabry-Perot interference filter 1 of the above-described embodiment, the trench 52 extending annularly so as to surround the terminals 15 and 16 may be provided with the polysilicon layer 27a, and a trench 53 extending annularly so as to surround the terminals 15 and 16 may be provided with the polysilicon layer 25c. According to Modified Example 3, similarly to the above-described embodiment, it is possible to suppress the occurrence of peeling of each layer on the substrate 11. Furthermore, in Modified Example 3, the electrical insulation between the polysilicon layer 25c in which the first electrode 12 is formed and the polysilicon layer 27a in which the third electrode 14 is formed can be enhanced. Therefore, it is possible to suppress the occurrence of leakage of current between the first electrode 12 and the third electrode 14 through the polysilicon layers 25c and 27a.

As in the Fabry-Perot interference filter ID of Modified Example 4 illustrated in FIG. 9(b), in the Fabry-Perot interference filter 1 of the above-described embodiment, the outer edge of the first laminate 22 may be positioned inside the outer edge of the intermediate layer 23 when viewed from the direction perpendicular to the first surface 11a, and the intermediate layer 23 may be interposed between the outer edge of the first laminate 22 and the second laminate 24. According to Modified Example 4, similarly to the above-described embodiment, it is possible to suppress the occurrence of peeling of each layer on the substrate 11. Furthermore, in Modified Example 4, the electrical insulation between the polysilicon layer 25c in which the first electrode 12 is formed and the polysilicon layer 27a in which the third electrode 14 is formed can be enhanced. As a result, it is possible to effectively suppress the occurrence of leakage of current between the first electrode 12 and the third electrode 14 through the polysilicon layers 25c and 27a.

Figure 10:
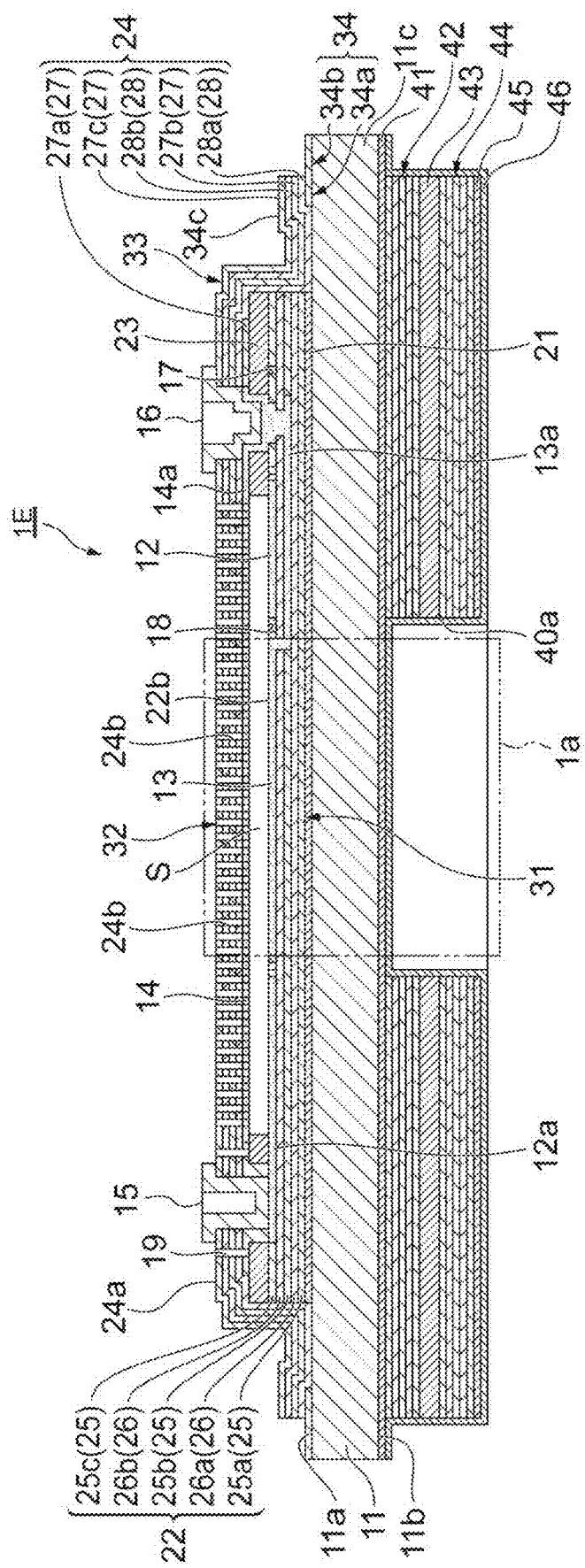
FIG. 10 is a cross-sectional view of a Fabry-Perot interference filter of Modified Example 5.

As in the Fabry-Perot interference filter 1E of Modified Example 5 illustrated in FIG. 10, in the Fabry-Perot interference filter 1 of the above-described embodiment, the portion covering the outer edge of the first laminate 22 and the intermediate layer 23 in the polysilicon layer 27a may be removed. According to Modified Example 5, similarly to the above-described embodiment, it is possible to suppress the occurrence of peeling in each layer on the substrate 11. Furthermore, in Modified Example 5, because the polysilicon layer 25c is covered with the silicon nitride layer 28a, the electrical insulation between the polysilicon layer 25c in which the first electrode 12 is formed and the polysilicon layer 27a in which the third electrode 14 is formed can be enhanced. Therefore, it is possible to suppress the occurrence of leakage of current between the first electrode 12 and the third electrode 14 through the polysilicon layers 25c and 27a.

REFERENCE SIGNS LIST

1: Fabry-Perot interference filter, 10: wafer, 11: substrate, 11a: first surface, 11b: second surface, 11c: outer edge portion, 22: first laminate (first layer), 23: intermediate layer, 24: second laminate (second layer), 24b: through hole, 31: first mirror portion, 32: second mirror portion, 33: covering portion, 34: peripheral edge portion, 42: third laminate (third layer), 43: intermediate layer (third layer), 44: fourth laminate (third layer), 50: removal scheduled portion, S: air gap.

The invention claimed is:
1. A Fabry-Perot interference filter comprising:
a substrate having a first surface;
a first layer having a first mirror portion disposed on the first surface;
a second layer having a second mirror portion facing the first mirror portion with an air gap interposed therebetween on a side opposite to the substrate with respect to the first mirror portion; and
an intermediate layer defining the air gap between the first layer and the second layer, wherein the substrate has an outer edge portion positioned outside an outer edge of the intermediate layer when viewed from a direction perpendicular to the first surface, wherein the second layer further includes:

a covering portion covering the intermediate layer; and a peripheral edge portion positioned on the first surface in the outer edge portion, wherein the second mirror portion, the covering portion, and the peripheral edge portion are integrally formed, and wherein the peripheral edge portion is thinned along an outer edge of the outer edge portion so as to include a non-thinned portion continuous with the covering portion and a thinned portion surrounding the non-thinned portion, and wherein a surface of the second layer on the first surface side in the peripheral edge portion is positioned more toward the first surface side than a surface of the first layer defining the air gap with the second layer.

2. The Fabry-Perot interference filter according to claim 1, wherein the covering portion covers an outer edge of the first layer.

3. The Fabry-Perot interference filter according to claim 1, wherein the first layer is a laminate including a silicon nitride layer.

4. The Fabry-Perot interference filter according to claim 1, wherein the second layer is a laminate including a plurality of layers, and wherein the peripheral edge portion is thinned along the outer edge of the outer edge portion by removing a portion of the plurality of layers.

5. The Fabry-Perot interference filter according to claim 1, further comprising a third layer disposed on a second surface of the substrate opposing to the first surface, wherein the third layer is thinned along the outer edge of the outer edge portion.

6. A method for producing a Fabry-Perot interference filter, the Fabry-Perot interference filter comprising:

a substrate having a first surface;

a first layer having a first mirror portion disposed on the first surface;

a second layer having a second mirror portion facing the first mirror portion with an air gap interposed therebetween on a side opposite to the substrate with respect to the first mirror portion; and an intermediate layer defining the air gap between the first layer and the second layer, wherein the substrate has an outer edge portion positioned outside an outer edge of the intermediate layer when viewed from a direction perpendicular to the first surface, wherein the second layer further includes:

a covering portion covering the intermediate layer; and a peripheral edge portion positioned on the first surface in the outer edge portion, wherein the second mirror portion, the covering portion, and the peripheral edge portion are integrally formed, and wherein the peripheral edge portion is thinned along an outer edge of the outer edge portion so as to include a non-thinned portion continuous with the covering portion and a thinned portion surrounding the non-thinned portion, and wherein a surface of the second layer on the first surface side in the peripheral edge portion is positioned more toward the first surface side than a surface of the first layer defining the air gap with the second layer, the method comprising:

a first step of preparing a wafer including a plurality of portions corresponding to the substrate and forming the first layer having the first mirror portion for each of the portions corresponding to the substrate;

a second step of forming the intermediate layer having a removal scheduled portion corresponding to the air gap for each of the portions corresponding to the substrate after the first step;

a third step of forming the second layer having the second mirror portion having a plurality of through holes formed therein, the covering portion covering the intermediate layer, and the peripheral edge portion thinned along the outer edge of the outer edge portion for each of the portions corresponding to the substrate after the second step;

a fourth step of forming the air gap positioned between the first mirror portion and the second mirror portion for each of the portions corresponding to the substrate by removing the removal scheduled portion by etching through the through hole after the third step; and a fifth step of obtaining the Fabry-Perot interference filter by cutting the wafer along the outer edge of the outer edge portion after the fourth step.

7. The method for producing the Fabry-Perot interference filter according to claim 6, wherein, in the fifth step, the wafer is cut along the outer edge of the outer edge portion by forming a modified region in an inner portion of the wafer along the outer edge of the outer edge portion by irradiation with a laser beam and by extending a crack from the modified region in a thickness direction of the wafer.

* * * * *